(12) United States Patent
Itou et al.

(10) Patent No.: US 7,147,992 B2
(45) Date of Patent: Dec. 12, 2006

(54) METHOD FOR MANUFACTURING ELECTROLUMINESCENT DEVICE

(75) Inventors: Norihito Itou, Tokyo (JP); Tomoyuki Tachikawa, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 340 days.

(21) Appl. No.: 10/469,771

(22) PCT Filed: Jan. 8, 2003

(86) PCT No.: PCT/JP03/00079

§ 371 (c)(1),
(2), (4) Date: Sep. 3, 2003

(87) PCT Pub. No.: WO03/086024

PCT Pub. Date: Oct. 16, 2003

(65) Prior Publication Data

US 2004/0224263 A1 Nov. 11, 2004

(30) Foreign Application Priority Data

Apr. 10, 2002 (JP) ............................. 2002-108357

(51) Int. Cl.
*C09K 11/00* (2006.01)
*H01J 9/227* (2006.01)

(52) U.S. Cl. ........................................ 430/321; 445/24

(58) Field of Classification Search .................. None
See application file for complete search history.

(56) References Cited

U.S. PATENT DOCUMENTS 5,953,585 A * 9/1999 Miyaguchi .................... 438/35

FOREIGN PATENT DOCUMENTS

| JP | 9-293589 A | 11/1997 |
| JP | 2001-185356 A | 7/2001 |
| JP | 2001-217078 A | 8/2001 |
| JP | 2001-237075 A | 8/2001 |
| JP | 2002-170673 | 6/2002 |

OTHER PUBLICATIONS

Computer-generated translation of JP 2001-237075, Mikiko et al., "Thin Film Element and Manufacturing Method of the Same", Aug. 2001.*

* cited by examiner

*Primary Examiner*—John A. McPherson
(74) *Attorney, Agent, or Firm*—Timothy J. Keefer; Seyfarth Shaw LLP

(57) ABSTRACT

A main object of the present invention is to provide a method for manufacturing an EL element which can avoid a state which plural unnecessary layers are laminated on each pattern-formed light-emitting portion when the light-emitting portions are formed by photolithography and thus enables quick and easy peeling treatment in the peeling process of the unnecessary layers. In order to achieve the aforementioned object, the present invention provides a method for manufacturing an electroluminescent element by photolithography, comprising: a process of providing a light-emitting portion of at least one color, having a photoresist layer on a surface thereof, on a substrate; a process of forming a heterochromatic light-emitting layer by coating the substrate with a heterochromatic light-emitting layer forming coating solution which expresses a different color from the color of the above light-emitting portion; a process of forming a photoresist layer for the heterochromatic light-emitting layer by coating the heterochromatic light-emitting layer with a photoresist; a process of pattern-exposing and developing the photoresist layer for the heterochromatic light-emitting layer, such that portions of the photoresist layer for the heterochromatic light-emitting layer which the heterochromatic light-emitting portion is to be formed, are remained; and a process of forming the heterochromatic light-emitting portion, having the photoresist layer for the heterochromatic light-emitting layer on the surface thereof, in a pattern by removing portions of the heterochromatic light-emitting layer which the photoresist layer for the heterochromatic light-emitting layer is removed.

14 Claims, 2 Drawing Sheets

METHOD FOR MANUFACTURING ELECTROLUMINESCENT DEVICE

CROSS REFERENCE TO RELATED APPLICATION

This application claims the priority of Japanese patent application serial No. 2002-108357, filed Apr. 10, 2002.

TECHNICAL FIELD

The present invention relates to a method for manufacturing an electroluminescent element having a light-emitting layer formed by employing a photolithography (the term "electroluminescent" will occasionally be referred to as "EL" hereinafter).

BACKGROUND ART

In an EL element, holes and electrons, which are injected from electrodes opposed to each other, are bonded to each other in a light-emitting layer, whereby the resulting energy excites a fluorescent material in the light-emitting layer and luminescence of a color in accordance with the fluorescent material is effected, so that EL elements are now becoming increasingly popular as a self-luminous sheet-shaped display element. Among EL elements, an organic film EL display, which employs an organic material as a light-emitting material, exhibits relatively high luminescence efficiency such that luminescence of high intensity can be realized when voltage a little less than 10 V is applied, and emitting light with a simple element structure is possible. Accordingly, it is expected that the organic film EL display can be applied to a low-cost indication display having a simple structure, such as an advertisement device which indicates specific patterns by emitting light.

When a display using such an EL element is produced, patterning of a first electrode layer and an organic EL layer is generally carried out. Examples of patterning method of such an EL element include: a method of vapor-depositing a light-emitting material via a shadow mask; a method of coating selectively by inkjet; a method of destroying specific light-emitting colorants by UV radiation; a screen-printing method; and the like. However, according to the aforementioned conventional methods, it is not possible to provide an EL element which satisfies all the requirements such as high luminescence efficiency, high "yield" of light eventually obtained, simple and easy production process and highly minute and precise pattern formation.

As a solution for solving the problems described above, a method for manufacturing an EL element has been proposed, in which a light-emitting layer is formed by patterning by photolithography. This method dose not require a vacuum facilities and the like equipped with highly precise alignment mechanism so that it makes production of EL elements relatively easy in low cost, as compared with the conventional patterning method by vapor-depositing. On the other hand, this method is preferable because structures for assisting patterning or pre-treatments of a substrate is not necessary, as compared with the patterning method using inkjet. To form highly precise patterns, the method for manufacturing an EL element by photolithography is more advantageous and preferable than the patterning method using inkjet, considering a discharge precision of an inkjet head.

An example of a method of forming a plurality of light-emitting portions by such a photolithography is shown in FIG. 2.

As shown in FIG. 2(a), a first electrode layer 2 is formed in a pattern on a substrate 1, a first light-emitting portion 3 is formed in a pattern on the fist electrode layer 2, and a fist photoresist layer 4 is laminated on the first light-emitting portion 3.

Next, as shown in FIG. 2(b), a second light-emitting layer 5 is formed by coating the substrate with a second light-emitting layer forming coating solution. And a positive-type photoresist is coated on the entire surface of the second light-emitting layer 5, whereby a second photoresist layer 4' is formed. Then, as shown in FIG. 2(c), only the portions which the first light-emitting portion 3 and a second light-emitting portion are to be formed, are masked by a photomask 6 and the remaining portions are exposed to ultraviolet.

The product is developed by a photoresist developer and washed, whereby the second photoresist layer 4' of the exposed portions is removed, as shown in FIG. 2(d). Further, portions of the second light-emitting layer 5, which is bared as a result of removal of the second photoresist layer 4' at the exposed portion, are removed. A second light-emitting portion 5' coated with the second photoresist layer 4', and the first light-emitting portion 3 coated with the first photoresist layer 4, the second light-emitting layer 5 and the second photoresist layer 4' are obtained, as shown in FIG. 2(e).

Next, same as the pattern formation of the second light-emitting portion 5', a third light-emitting layer forming coating solution is coated on the substrate, as shown in FIG.2(f), whereby a third light-emitting layer 7 as a film is formed. And a positive-type photoresist is coated on the entire surface of the third light-emitting layer 7, whereby a third photoresist layer 4" is formed. Then, as shown in FIG. 2(g), portions which the first light-emitting portion 3, the second light-emitting portion 5' and a third light-emitting portion 7' are to be formed, are masked by a photomask 6 and the remaining portions are exposed to ultraviolet.

The product is developed by a photoresist developer and washed, whereby the third photoresist layer 4" is formed in a pattern, as shown in FIG. 2(h). Then, the third light-emitting layer 7, which is bared as a result of removal of the third photoresist layer 4" at the exposed portions, are removed. As a result, a third light-emitting portion 7' coated with the third photoresist layer 4" is obtained, as shown in FIG. 2(i). On the second light-emitting portion 5', the second photoresist layer 4', the third light-emitting layer 7 and the third photoresist layer 4" are laminated. On the other hand, the first photoresist layer 4, the second light-emitting layer 5, the second photoresist layer 4', the third light-emitting layer 7 and the third photoresist layer 4" are laminated on the first light-emitting portion 3.

Finally, by peeling treatment using a photoresist peeling solution, the first light-emitting portion 3, the second light-emitting portion 5' and the third light-emitting portion 7' are bared, as shown in FIG. 2(j).

Thereafter, further processes including a process of forming a second electrode layer on each light-emitting portion are carried out, whereby an EL element which emits luminescence in the direction toward the bottom of the page in FIG. 2(j) is produced.

However, in the conventional method as described above, it is difficult to peel the photoresist layer quickly in the peeling treatment of the photoresist layer at the final stage from FIG. 2(i) to FIG. 2(j). Because a plurality of light-emitting layers and photoresist layers are laminated on the target photoresist layer to be treated, the area of the target photoresist layer to be treated, where the target photoresist layer is brought into contact with the photoresist peeling solution, is small. Accordingly, it takes a very long time for the photoresist peeling solution to act on the photoresist layer in the sufficient manner. When the substrate is exposed to the photoresist peeling solution for a long time, not only the production efficiency is decreased but also the pattern-formed layers may be swollen and dissolved by the influence of the photoresist peeling solution, which is inconvenient. Therefore, it has been a demand for a method in which the photoresist peeling solution can easily act on the photoresist layer in the peeling treatment thereof.

DISCLOSURE OF INVENTION

The present invention has been contrived in consideration of the problems described above. A main object of the present invention is to provide a method for manufacturing an EL element which can avoid a state which plural unnecessary layers are laminated on each pattern-formed light-emitting portion when the light-emitting portions are formed by photolithography and thus enables quick and easy peeling treatment in the peeling process of the unnecessary layers.

In order to achieve the aforementioned object, the present invention provides a method for manufacturing an electroluminescent element by photolithography, comprising: a process of providing a light-emitting portion of at least one color, having a photoresist layer on a surface thereof, on a substrate; a process of forming a heterochromatic light-emitting layer by coating the substrate with a heterochromatic light-emitting layer forming coating solution which expresses a different color from the color of the above light-emitting portion; a process of forming a photoresist layer for the heterochromatic light-emitting layer by coating the heterochromatic light-emitting layer with a photoresist; a process of pattern-exposing and developing the photoresist layer for the heterochromatic light-emitting layer, such that portions of the photoresist layer for the heterochromatic light-emitting layer which the heterochromatic light-emitting portion is to be formed, are remained; and a process of forming the heterochromatic light-emitting portion, having the photoresist layer for the heterochromatic light-emitting layer on the surface thereof, in a pattern by removing portions of the heterochromatic light-emitting layer which the photoresist layer for the heterochromatic light-emitting layer is removed.

When the light-emitting layers is patterned by the photolithography according to the method for manufacturing an EL element of the present invention, at the stage which the patterning of each light-emitting portion is completed, each light-emitting portion has no light-emitting layer of a different color laminated thereon but has only a single layer of photoresist layer laminated thereon. As a result, at the stage which the photoresist layer is finally peeled off, the target photoresist layer to be peeled off is positioned at the uppermost layer and thus the photoresist peeling solution can easily act, whereby the peeling treatment can be carried out quickly and easily. Accordingly, the peeling treatment hardly affects the substrate and the like, so that the production efficiency is improved.

Further, the present invention provides a method for manufacturing an electroluminescent element by photolithography, comprising: a process of providing a first light-emitting portion having a first photoresist layer on a surface thereof, on a substrate; a process of forming a second light-emitting layer by coating the substrate with a second light-emitting layer forming coating solution; a process of forming a second photoresist layer by coating the second light-emitting layer with a photoresist; a process of pattern-exposing and then developing the second photoresist layer, such that portions of the second photoresist layer which the second light-emitting portion is to be formed, are remained; a process of forming the second light-emitting portion, having the second photoresist layer on the surface thereof, in a pattern by removing portions of the second light-emitting layer which the second photoresist layer is removed; a process of providing the first light-emitting portion having the first photoresist layer on a surface thereof, and the second light-emitting portion having the second photoresist layer on a surface thereof, on a substrate; a process of forming a third light-emitting layer by coating the substrate with a third light-emitting layer forming coating solution; a process of forming a third photoresist layer by coating the third light-emitting layer with a photoresist; a process of pattern-exposing and then developing the third photoresist layer, such that portions of the third photoresist layer which the third light-emitting portion is to be formed, are remained; a process of forming the third light-emitting portion, having the third photoresist layer on a surface thereof, in a pattern by removing portions of the third light-emitting layer which the third photoresist layer is removed.

The method for manufacturing an EL element of the present invention is characterized in that, in the patterning process of the light-emitting layer of the second color, only the portions, which the light-emitting portion of the second color is to be formed, of the photoresist layer is remained. The light-emitting layer of the third color is patterned in the same way. It makes a condition possible that, at the stage which the patterning of each light-emitting layer is completed, each light-emitting layer has no light-emitting layer of a different color laminated thereon but has only a single layer of photoresist layer laminated thereon. In this case, at the stage which the photoresist layer is finally peeled off, the photoresist layer is positioned at the uppermost layer and the photoresist peeling solution can immediately act on the photoresist layer, whereby the photoresist layer can be quickly peeled off without applying any additional force. Accordingly, the production efficiency in manufacturing an EL element of full colors is improved. Further, as the substrate is not needed to be exposed for a long time to the photoresist peeling solution, the influence of the peeling solution on the substrate and the like can be suppressed to the minimum, so that the process yield is improved.

In the method described above, it is preferable that each of the light-emitting layers is insoluble to the photoresist solvent, the photoresist developer and the photoresist peeling solution and that each of the photoresist layers is insoluble to the solvent used for forming each light-emitting layers described above.

Though it depends on the type of the photolithography, it is for eliminating a possibility of inconvenience such as swelling and elution due to influence to a layer which has already been formed and/or layers other than the target layer of the treatment at the stage of laminating other layers and the stage of development.

It is preferable that each of the light-emitting portions described above is subjected to the patterning process together with the buffer layer and formed on a buffer layer. The buffer layer is provided in between the first electrode layer and the light-emitting layer and functions so as to assist the injection of electric charge to the light-emitting layer. In short, provision of a buffer layer increases the efficiency in charge injection and thus improves light-emitting efficiency.

Further, in the method for manufacturing an EL element by photolithography described above, after patterning each photoresist layer by coating each light-emitting layer to be patterned with photoresist, exposing and developing, it is preferable that portions of each light-emitting layer which each photoresist layer is removed, are patterned by dry etching.

Thus conducting dry etching at the time of patterning light-emitting layers is preferable because layers other than the target light-emitting layer to be pattern-formed is then less likely to be affected by patterning and thus more precise pattern formation can be enabled.

In this case, the type of the dry etching is preferably a reactive ion etching. By employing reactive ion etching, light-emitting layers or the buffer layer can effectively be removed.

Further, oxygen alone or a gas containing oxygen is preferably used in the dry etching.

Use of oxygen alone or a gas containing oxygen is preferable because the light-emitting layers or the buffer layer can effectively be removed by the oxidizing reaction, without affecting the substrate or ITO.

Yet further, atmospheric pressure plasma is preferably used in the dry etching. Use of atmospheric pressure plasma is preferable because the vacuum process is not necessary and patterning of high productivity can be enabled.

BEST MODE FOR CARRYING OUT THE INVENTION

Figure 1A:
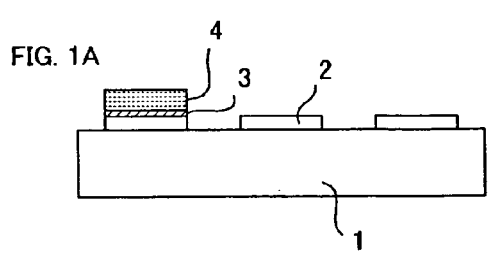
FIG. 1 is a process drawing showing one example of a method for manufacturing an EL element of the present invention.
Figure 1F:
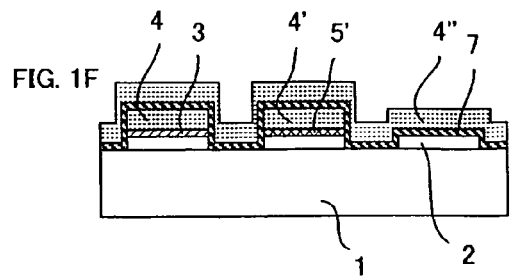

A method for manufacturing an EL element of the present invention will be described hereinafter.

The method for manufacturing an electroluminescent element by photolithography, in the present invention, comprising: a process of providing a light-emitting portion of at least one color, having a photoresist layer on a surface thereof, on a substrate; a process of forming a heterochromatic light-emitting layer by coating the substrate with a heterochromatic light-emitting layer forming coating solution which expresses a different color from the color of the above light-emitting portion; a process of forming a photoresist layer for the heterochromatic light-emitting layer by coating the heterochromatic light-emitting layer with a photoresist; a process of pattern-exposing and developing the photoresist layer for the heterochromatic light-emitting layer, such that portions of the photoresist layer for the heterochromatic light-emitting layer which the heterochromatic light-emitting portion is to be formed, are remained; and a process of forming the heterochromatic light-emitting portion, having the photoresist layer for the heterochromatic light-emitting layer on the surface thereof, in a pattern by removing portions of the heterochromatic light-emitting layer which the photoresist layer for the heterochromatic light-emitting layer is removed.

In the present invention, the "heterochromatic light-emitting layer" represents a light-emitting layer which exhibits a color different from the color of a light-emitting portion which has already been pattern-formed on the substrate. For example, in a case in which a light-emitting portion of red color has already been formed on the substrate, "a heterochromatic light-emitting layer" represents a light-emitting layer of green or blue color. In a case in which light-emitting portions of two colors, e.g., red and green have already been formed on the substrate, "a heterochromatic light-emitting layer" represents a light-emitting layer of blue color. Further, "a heterochromatic light-emitting layer forming coating solution" represents a forming coating solution used for forming such a heterochromatic light-emitting layer as described above.

In the aforementioned method for manufacturing an EL element, the patterning process of a light-emitting portion of the second or subsequent color is described by using the terms of "a heterochromatic light-emitting layer", "a heterochromatic light-emitting layer forming coating solution" and "a heterochromatic light-emitting portion". As a specific example thereof, a patterning process of each light-emitting portion of an EL element constituted of three light-emitting portions will be described hereinafter, in the order of formation.

It should be noted that the following description of a manufacturing method of the present invention is the one when the EL element of full-color is manufactured. Accordingly, in the following description, "the heterochromatic light-emitting layer" is represented by the second or the third light-emitting layer, "the heterochromatic light-emitting layer forming coating solution" is represented by the second or the third light-emitting layer forming coating solution, "the heterochromatic light-emitting portion" is represented by the second or the third light-emitting portion, and "the photoresist layer for the heterochromatic light-emitting layer" is represented by the second or the third photoresist layer.

Specifically, such a method for manufacturing an EL element comprises: a process of providing a first light-emitting portion having a first photoresist layer on a surface thereof, on a substrate; a process of forming a second light-emitting layer by coating the substrate with a second light-emitting layer forming coating solution; a process of forming a second photoresist layer by coating the second light-emitting layer with a photoresist; a process of pattern-exposing and then developing the second photoresist layer, such that portions of the second photoresist layer which the second light-emitting portion is to be formed, are remained; a process of forming the second light-emitting portion, having the second photoresist layer on the surface thereof, in a pattern by removing portions of the second light-emitting layer which the second photoresist layer is removed; a process of providing the first light-emitting portion having the first photoresist layer on a surface thereof, and the second light-emitting portion having the second photoresist layer on a surface thereof, on a substrate; a process of forming a third light-emitting layer by coating the substrate with a third light-emitting layer forming coating solution; a process of forming a third photoresist layer by coating the third light-emitting layer with a photoresist; a process of pattern-exposing and then developing the third photoresist layer, such that portions of the third photoresist layer which the third light-emitting portion is to be formed, are remained; a process of forming the third light-emitting portion, having the third photoresist layer on a surface thereof, in a pattern by removing portions of the third light-emitting layer which the third photoresist layer is removed.

As described above, the present invention is characterized in that, in the patterning process of the light-emitting portion of the second color, the photoresist layer is pattern-exposed such that only portions which the light-emitting portion of the second color is to be formed are remained as unexposed areas. The light-emitting portion of the third color is patterned in the same way.

Figure 2A:
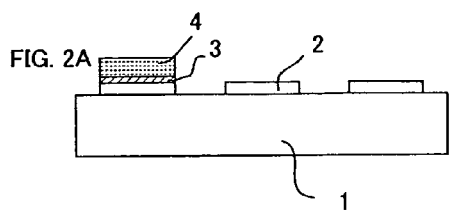
FIG. 2 is a process drawing showing one example of a conventional method for manufacturing an EL element.
Figure 2B:
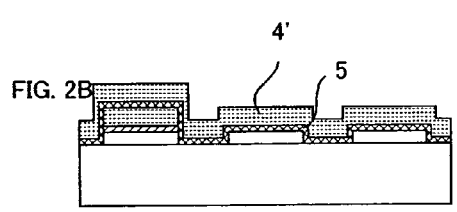
Figure 2C:
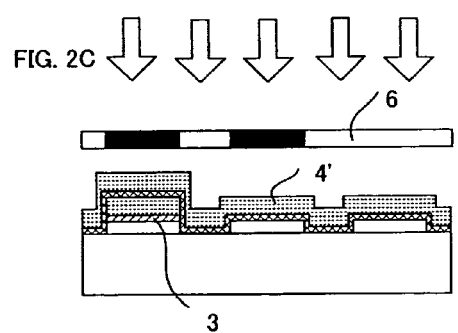
Figure 2D:
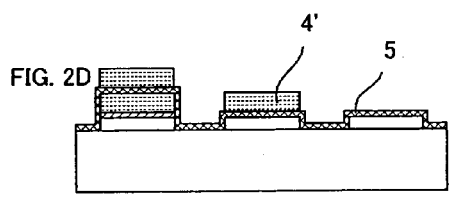
Figure 2E:
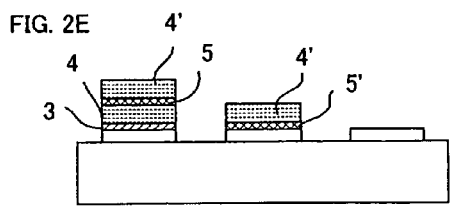
Figure 2F:
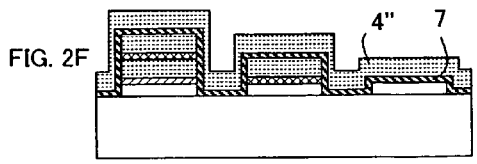
Figure 2G:
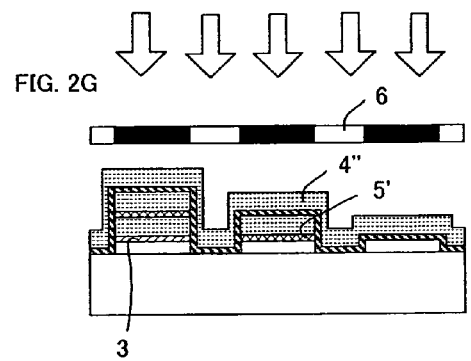
Figure 2H:
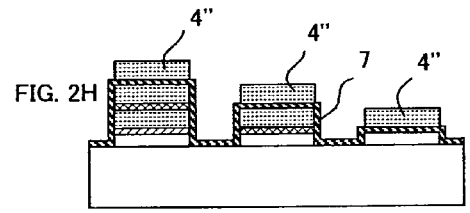

Conventionally, in the process of pattern-exposure, not only portions which the light-emitting portion as the target of the patterning is to be formed, but also light-emitting portion(s) which has already been pattern-formed, are masked, as shown in FIG. 2(c) and FIG. 2(g). On the contrary, in the present invention, the light-emitting portion(s) which has already been pattern-formed are exposed, without being masked by a photomask, as described above, whereby no unnecessary photoresist layer is laminated on a light-emitting portion which has already been pattern-formed. Accordingly, at the stage of completing the patterning of each light-emitting portion, each light-emitting portion has no light-emitting layer of a different color laminated thereon but formed in such a condition that has only a single layer of photoresist layer laminated thereon. In this condition, at the stage which the photoresist layer is peeled off, the photoresist layer to be peeled off is positioned as the uppermost layer. Thus, a sufficiently large area in which the photoresist layer is brought into contact with the photoresist peeling solution used for the peeling treatment is ensured and peeling of the photoresist layer can be quickly effected.

In the present invention, "a light-emitting layer" represents a layer formed by coating a light-emitting layer forming coating solution and drying. "A light-emitting portion" represents a light-emitting layer which is formed at a predetermined position.

FIG. 1 shows one example of the manufacturing process of the EL element of the present invention, with the above mentioned characteristics. The manufacturing process will be described in detail hereinafter, with reference to FIG. 1.

In the example shown in FIG. 1, a substrate 1, provided with a first electrode layer 2 and a first light-emitting portion 3 having a first photoresist layer 4 on a surface thereof, is prepared at first, as shown in FIG. 1(a) (the process of preparing the first light-emitting portion). In the present invention, the conventional photolithography may be employed in the patterning process of the first light-emitting portion 3.

Figure 1B:
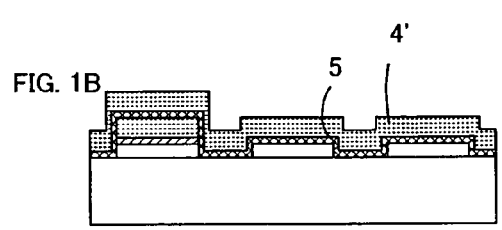

Next, as shown in FIG. 1(b), a second light-emitting layer forming coating solution is coated, so that a second light-emitting layer 5 is formed. Positive-type photoresist is then coated on the entire surface, whereby a second photoresist layer 4' is formed (the process of forming the second photoresist layer).

Figure 1G:
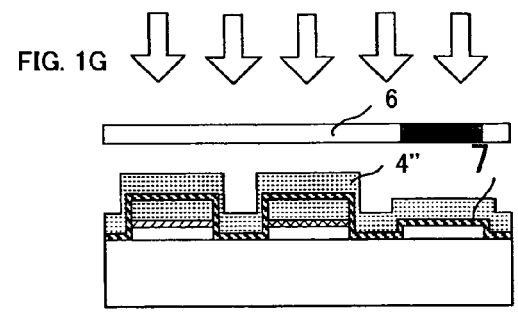
Figure 1C:
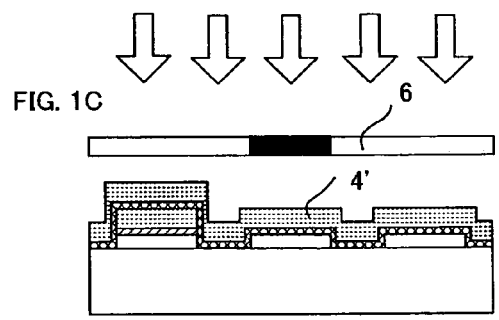
Figure 1H:
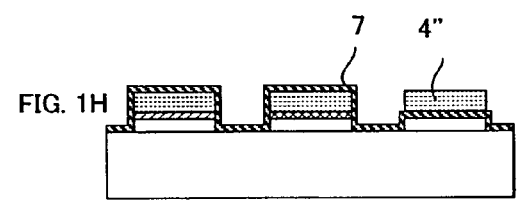
Figure 1D:
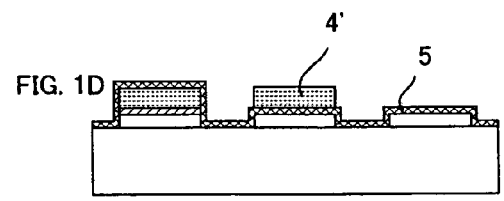

Thereafter, as shown in FIG. 1(c), only portions which the second light-emitting portion is to be formed, are masked with a photomask 6 and the remaining portions are exposed to ultraviolet. The second photoresist layer 4' is then developed by a photoresist developer and washed. As a result, the portions which the second light-emitting portion is to be formed, of the second photoresist layer 4' are remained, as shown in FIG. 1(d) (the process of patterning the second photoresist layer).

Figure 1I:
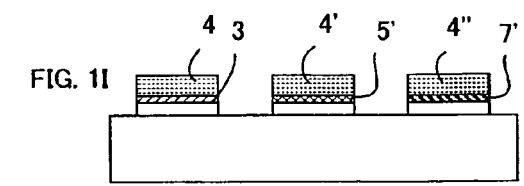
Figure 1E:
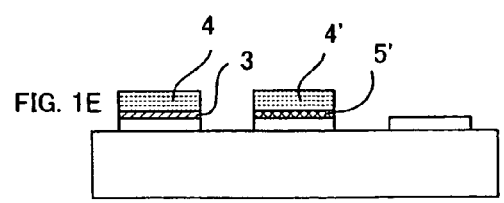

Portions of the second light-emitting layer 5 which is bared as a result of removal of the second photoresist layer 4', are removed. A second light-emitting portion 5' coated with the second photoresist layer 4' and the first light-emitting portion 3 coated with the first photoresist layer 4 are remained, as shown in FIG. 1(e) (the process of forming the second light-emitting portion).

In the method for manufacturing an EL element shown in the example, a series of subsequent manufacturing processes are further required in order to form light-emitting portions of three colors. However, in a case of an EL element with light-emitting portions of only two colors, the photoresist layer may be peeled off after the above, going through the process of forming the second electrode layer on each light-emitting portion, whereby an EL element may be manufactured. In this case, the photoresist layer to be removed or peeled off is positioned at the uppermost layer, as shown in FIG. 1(e), there is an advantage that the peeling treatment can be quickly effected. In short, when an EL element of two colors is produced, the photoresist layer can be peeled off easily and thus the production efficiency is higher and the EL element with fewer damage in the substrate can be provided.

Next, the patterning of a light-emitting portion of the third color is carried out. The third light-emitting layer forming coating solution is coated on the substrate 1 which is provided with the first electrode layer 2, the first light-emitting portion 3 having the first photoresist layer 4 on a surface thereof and the second light-emitting portion 5' having the second photoresist layer 4' on a surface thereof, as shown in FIG. 2(f), so that a third light-emitting layer 7 is formed. Positive-type photoresist is then coated on the third light-emitting layer 7, whereby a third photoresist layer 4" is formed (the process of forming the third photoresist layer).

Thereafter, as shown in FIG. 1(g), only portions which the third light-emitting portion is to be formed, are masked with a photomask 6 and the remaining portions are exposed to ultraviolet. And then developed by the photoresist developer and washed. As a result, the portions of the third photoresist layer 4" which the third light-emitting portion is not to be formed, are removed, as shown in FIG. 1(h) (the process of patterning the third photoresist layer).

Portions of the third light-emitting layer 7 which is bared as a result of removal of the third photoresist layer 4', are removed. A third light-emitting portion 7' with the third photoresist layer 4" on the surface thereof is remained, as shown in FIG. 1(i) (the process of forming the third light-emitting portion).

In the present invention, in the patterning process of the third photoresist layer, only portions which the third light-emitting portion is to be formed, are pattern-exposed via the photomask. As a result, such a condition that the first light-emitting portion has one layer of the first photoresist layer laminated thereon and the second light-emitting portion has one layer of the second photoresist layer laminated thereon.

Figure 1J:
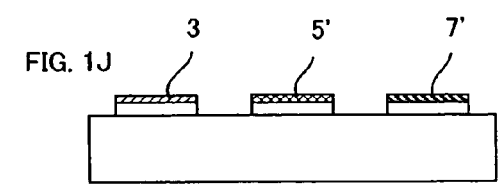

Finally, each photoresist layers positioned at the uppermost layer is peeled off, as shown in FIG. 1(j) (the peeling process) and the second electrode layer is formed on each light-emitting layers which is bared, whereby a light-emitting EL element in the direction toward the bottom of the figure, is can be manufactured.

Hereinafter, each process in the method for manufacturing an EL element of the present invention will be described in detail.

1. The Process of Preparing the First Light-emitting Portion

In the present process, the first electrode layer is formed on a substrate. The first light-emitting layer is formed by coating the substrate with the first light-emitting layer forming coating solution. Photoresist is coated on the entire surface of the first light-emitting layer, so that the first photoresist layer is formed. Then only portions which the first light-emitting portion is to be formed, are masked with a photomask, and pattern-exposed. Next, the exposed portions of the first photoresist layer are developed by a photoresist developer. As a result, the exposed portions of the first photoresist layer are removed, and portions of the first light-emitting layer which were positioned below the removed first photoresist layer, are bared. The bared portions of the first light-emitting layer are removed, whereby the first light-emitting portion having the first photoresist layer on the surface thereof is obtained.

Hereinafter, the structure of the present process will be described.

(Substrate)

The substrate used in the present invention is not particularly limited, as long as the substrate is highly transparent. An inorganic material such as glass and a transparent resin can be used.

The transparent resin is not particularly limited, as long as the resin can be molded into a film-like shape. A polymeric material which is highly transparent, exhibits relatively high solvent-resistance, and heat-resistance is preferable. Specific examples include polyether sulfone, polyethylene terephthalate (PET), polycarbonate (PC), polyetheretherketone (PEEK), polyvinyl fluoride (PFV), polyacrylate (PA), polypropylene (PP), polyethylene (PE), amorphous polyolefin and a fluorine-base resin.

(First Electrode Layer)

A first electrode layer is formed on the substrate, as described above. The type of the first electrode layer is not particularly limited, as long as it is the type generally used for an EL element.

The first electrode layer is previously formed on the substrate, however, the second electrode layer is formed after the formation of the light-emitting layers. These electrode layers are constituted of an anode and a cathode. It is preferable that one of the anode or the cathode is transparent or semi-transparent, and the anode is made of a conductive material having a large work function, so that holes can easily be injected. The cathode is preferably made of a conductive material having a small work function, so that electrons can easily be injected. Plural types of materials may be used in combination. It is preferable that each electrode layers has as small resistance as possible. Although metal materials are generally used, organic materials or inorganic compounds may be used.

(The First Light-emitting Layer Forming Coating Solution)

In the present invention, a first light-emitting layer forming coating solution is coated on the substrate which at least the first electrode layer is formed, and the coating is dried, so that the first light-emitting layer is formed on the substrate.

Such a first light-emitting layer forming coating solution as described above generally contains a light-emitting material, a solvent, and additives such as a doping agent. In the present invention, the manufacturing method of EL element is that light-emitting layers of different types are patterned by photolithography, a plurality of times, so that light-emitting portions of a plurality of types are formed on the substrate, light-emitting layers of plurality of color are formed. Accordingly, plurality of types of light-emitting layer forming coating solutions are used. Hereinafter, each of the materials which constitute these light-emitting layer forming coating solutions will be described.

A. Light-emitting Materials

The light-emitting material used in the present invention is not particularly limited, as long as the material contains a fluorescent emitting material and emit light. The light-emitting material may exhibit both light-emitting function and the hole transporting function or the electron transporting function. In the present invention, since the light-emitting layers is patterned by photolithography method, as described below, it is preferable that the material which constitutes the light-emitting layer is not soluble to any of the below described photoresist solvent, the photoresist developer and the photoresist peeling solution. In this case, the photoresist used in the patterning process of the light-emitting layer by photolithography method is preferably insoluble to the solvent used for the formation of the light-emitting layer.

Examples of such a light-emitting material include a colorant-base material, a metal complex-base material and a polymer-base material.

(1) Colorant-base Material

Examples of the colorant-base material include cyclopentamine derivative, tetraphenyl butadiene derivative, triphenylamine derivative, oxadiazole derivative, pyrazoloquinoline derivative, distyrylbenzene derivative, distyrylarylene derivative, silole derivative, thiophene ring compound, pyridine ring compound, perinone derivative, perylene derivative, oligothiophene derivative, trifumanylamine derivative, oxodiazole dimer, pyrazoline dimer and the like.

(2) Metal Complex-base Material

Examples of the metal complex-base material include metal complexes which has Al, Zn, Be or rare metals such as Tb, Eu, Dy as a core metal, and has oxadiazole, thiadiazole, phenylpyridine, phenylbenzoimidazole or a quinoline structure as a ligand. Specific examples of such metal complex include aluminum-quinolinol complex, benzoquinolinol-beryllium complex, benzooxazole-zinc complex, benzothiazole-zinc complex, azomethyl-zinc complex, porphyrin-zinc complex, and europium complex.

(3) Polymer-base Material

Examples of the polymer-base material include those obtained by polymerizing polyfluorene derivative, polyvinyl carbazole derivative, their plastid, or the metal complex-base light-emitting materials such as polyparaphenylenevinylene derivative, polythiophen derivative, polyparaphenylene derivative, polysilane derivative, polyacetylene derivative.

In the present invention, the polymer-base material are preferably used as a light-emitting material, in terms of making the best use of the advantage that the light-emitting portion can be formed in a highly precise manner by photolithography using a light-emitting layer forming coating solution.

B. Solvent

There is a case in which a light-emitting layer forming coating solution is coated on a photoresist layer, as is clearly shown in the example of FIG. 1. Thus, as the solvent used for such a light-emitting layer forming coating solution, it is preferable to select a solvent whose solubility to the photoresist at 25° C. at 1 atom is no larger than 0.001 (g/g of the solvent), more preferably no larger than 0.0001 (g/g of the solvent). For example, in which the below mentioned buffer layer is soluble to a polar solvent such as a water-base solvent, DMF, DMSO, alcohol and the photoresist is a novolak-base positive-type resist which is generally employed, examples of the solvent include: aromatic solvents such as isomers of benzene, toluene, xylene and a mixture thereof and isomers of mesitylene, tetralin, p-cymene, cumene, ethylbenzene, diethylbenzene, butylbenzene, chlorobenzene, dichlorobenzene and a mixture thereof; ether-base solvents such as anisole, phenetole, butylphenyl ether, tetrahydrofuran, 2-butanone, 1,4-dioxane, diethyl ether, diisopropyl ether, diphenyl ether, dibenzyl ether, diglyme; chloro-base solovents such as dichloromethane, 1,1-dichloroethane, 1,2-dichloroethane, trichloroethylene, tetrachloroethylene, chloroform, carbon tetrachloride, 1-chloronaphthalene; cyclohexanone; and the like. The solvent not listed in the above can be used as long as it meets with the requirements. Two or more types of solvents may be used in a mixed manner.

To prevent the buffer layer and the light-emitting layer material from being dissolved and mixed with each other during the film-forming process for the light-emitting layer, and to maintain the original light-emitting property of the light-emitting material, it is preferable that the buffer layer is not dissolved by the solvent.

For the reason described above, it is preferable to select, as the solvent used for a light-emitting layer forming coating solution, a solvent whose solubility to the buffer layer material at 25° at 1 atom is no larger than 0.001 (g/g of the solvent) or more preferably no larger than 0.0001 (g/g of the solvent)

C. Additives

The light-emitting layer forming coating solution used in the present invention may contain additives of various types, other than the light-emitting materials and the solvent described above. For example, a doping material may optionally be added for the purpose of improving the light-emitting efficiency of the light-emitting layer, changing the light-emitting wavelength or the like. Examples of the doping material include perylene derivative, coumalin derivative, rubrene derivative, quinacridone derivative, squalium derivative, porphyrin derivative, styryl-base colorant, tetracene derivative, pyrazoline derivative, decacyclene, phenoxazone and the like.

(First Photoresist Layer)

Next, the first photoresist layer formed on the first light-emitting layer will be described. Although three types of photoresist layers, i.e., the first, the second and the third photoresist layers are used in the present invention. The three types of the photoresist layers are distinguished from each other only for convenience in description, so that all of them may be the same kind of photoresist.

The method of coating photoresist is not particularly limited as long as it is a common method of coating a coating solution on the entire surface. Specific examples of the method include spin coating method, casting method, dipping method, bar coating method, blade coating method, roll coating method, gravure coating method, flexo printing method, spray coating method and the like.

In the present invention, the photoresist layer is laminated on a light-emitting layer as described above, and the light-emitting layer is patterned by photolithography. It should be noted that the unique feature of the present invention lies in the pattern-exposure during the patterning process for the light-emitting layer. Photolithography method is a method of forming a desired pattern which corresponds to a light-irradiation pattern, by utilizing changes in solubility at the light-irradiated portions of a film caused by irradiation of light.

Hereinafter, the photoresist, the photoresist solvent and the photoresist developer used in the process will be described.

A. Photoresist

The photoresist which can be used in the present invention is not particularly limited and may be of either positive or negative type. The photoresist is preferably insoluble to the solvent used for forming an organic EL layer such as a light-emitting layer.

Specific examples of the photoresist applicable include a novolak resin-base, (rubber+bisazide)-base or the like.

B. Photoresist Solvent

In the present invention, it is preferable to use, as the photoresist solvent used for the coating of the photoresist, a solvent which does not dissolve the material of the organic EL material such as, so that the material of the organic EL layer such as light-emitting layer and the material of the photoresist are prevented from being dissolved and mixed with each other during the film-forming process for the photoresist, and the original light-emitting property is maintained. For the reason described above, it is preferable to select, as the photoresist solvent used in the present invention, a solvent whose solubility to the material for forming the organic EL layer such as a material for forming the light-emitting layer, at 25° at 1 atom is no larger than 0.001 (g/g of the solvent) or more preferably no larger than 0.0001 (g/g of the solvent).

In a case in which the material for forming the buffer layer is soluble to a water-base solvent and the light-emitting layer is soluble to a non-polar organic solvent such as an aromatic-base solvent, examples of the photoresist solvent include: ketones such as acetone, methylethyl ketone; cellosolve acetates such as propylene glycol monoethyl ether acetate, propylene glycol monomethyl ether acetate, ethylene glycol monomethyl ether acetate, ethylene glycol monoethyl ether acetate; cellosolves such as propylene glycol monoethyl ether, propylene glycol monomethyl ether, ethylene glycol monomethyl ether, ethylene glycol monoethyl ether; alcohol such as methanol, ethanol, 1-butanol, 2-butanol, cyclohexanol; an ester-base solvent such as ethyl acetate, butyl acetate; cyclohexane; dekalin; and the like. The photoresist solvent of the present invention is not limited to the aforementioned examples, and solvents of other types which satisfy the requirements may be used. Two or more types of solvents maybe used in a mixed manner.

C. Photoresist Developer

Next, the developer used in the patterning process for the photoresist layer of the present invention will be described.

The photoresist developer used in the present invention is not particularly limited, unless the developer dissolves the material which forms the aforementioned light-emitting layer. Specific examples of the photoresist developer include an organic alkali-base developer which is generally used; an inorganic alkali-base developer; and an aqueous solution which can develop the photoresist layer can also be used. It is preferable to clean the photoresist layer with water after the development process.

It is preferable to select, as the developer used in the present invention, a developer whose solubility to the material for forming a light-emitting layer at 25° at 1 atom is no larger than 0.001 (g/g of the developer) or more preferably no larger than 0.0001 (g/g of the developer).

(Buffer Layer)

In the present invention, a buffer layer may be provided on the substrate. The buffer layer of the present invention represents a layer, including an organic substance and, in particular, an organic conductive pair, provided between the anode and the light-emitting portion or between the cathode and the light-emitting portion, so that electric charge is easily injected to the light-emitting portion. The buffer layer may be made of conductive polymer, for example, which functions by improving the efficiency in injecting holes to the light-emitting portion and making an irregular surface of the electrode or the like sufficiently flat.

When the buffer layer of the present invention is highly conductive, it is preferable that the buffer layer is patterned so that the diode property of the element is maintained and crosstalk is prevented. When the buffer layer has high resistance, patterning may not be necessary. If provision of the buffer layer in the EL element is not essential, the buffer layer may be omitted.

In the present invention, in a case in which the buffer layer is also formed by patterning according to photolithography, it is preferable to select, as the material of the buffer layer, a material which is insoluble to the photoresist solvent and the solvent used for forming the light-emitting layer, and it is more preferable to select, as the material of the buffer layer, a material which is also insoluble to the photoresist peeling solution.

Specific examples of the material of the buffer layer used in the present invention include: polymer of a hole transporting substance such as polyalkyl thiophene derivative, polyaniline derivative, triphenylamine; a sol-gel film of inorganic oxides; polymeric film of an organic substance such as trifluoromethane; and a film of an organic compound containing Lewis acid. However, the material of the buffer layer is not particularly limited to the aforementioned examples, as long as the material satisfies the requirements of solubility as described above. A material which reaches, after the formation of a film, a state in which such requirements as described above are satisfied as a result of a reaction, polymerization or sintering is also acceptable.

The solvent used for forming the buffer layer of the present invention is not particularly limited, as long as the buffer material can be dispersed or dissolved into the solvent. However, in a case in which the film-making process must be carried out a plurality of times, when patterning for manufacturing a full-color EL element is carried out, the buffer solvent must be a solvent which does not dissolve the photoresist material and preferably a solvent which does not dissolve the light-emitting layer.

It is preferable to select, as a buffer layer solvent of the present invention, a solvent which solubility of the photoresist material at 25° at 1 atom is no larger than 0.001 (g/g of the solvent) or more preferably no larger than 0.0001 (g/g of the solvent). In addition to this, it is preferable to select, as a buffer layer solvent of the present invention, a solvent which solubility of the material of the light-emitting layer at 25° at 1 atom is no larger than 0.001 (g/g of the solvent) and more preferably, no larger than 0.0001 (g/g of the solvent).

Specific examples of the solvent include water, alcohols such as methanol and ethanol, dimethylformamide, demethylacetoamide, demethyl sulfoxide, N-methyl-2-pyrolidone and the like. The solvent is not limited to the aforementioned examples, and solvents of other types which satisfy the requirements maybe used. Further, two or more types of solvents may be used in a mixed manner.

If necessary, a buffer layer made of curing resin or the like which is insoluble to a solvent may be used. Specific examples include a sol-gel reaction solution, a photo-setting resin and a thermosetting resin. More specifically, by using a buffer layer forming coating solution made by adding additives to make them act as a buffer layer to a sol-gel reaction solution, a photo-setting resin and thermosetting resin which have not been cured yet, or a buffer layer forming coating solution which is made to act as a buffer layer by modifying a sol-gel reaction solution, a photo-setting resin and thermosetting resin. By curing the aforementioned buffer layer forming coating solution, a buffer layer insoluble to a solvent may be used.

2. The Process of Forming the Second Photoresist Layer

Next, in the present invention, photoresist is coated on the entire surface of the substrate on which the second light-emitting layer is formed, whereby the second photoresist layer is formed.

As a photoresist used in the present process is similar to that described in "the process of preparing the first light-emitting portion" mentioned above, detailed description is omitted. The material of the first photoresist layer and the material of the second photoresist are the same, normally. However, if necessary, different materials may be used.

3. The Process of Patterning the Second Photoresist Layer

In the present invention, the process of pattering the second photoresist layer is a patterning process of: after the second photoresist layer is formed on the entire surface; portions of the second photoresist layer on which the second light-emitting portion is to be formed is masked by a photomask and pattern exposed; and by developing, the portions of the second photoresist layer, in which the second light-emitting portion is to be formed, are remained.

The present invention is characterized by that the position which is shielded with the photomask is limited to the region which the second light-emitting portion is to be formed, in the present process, and only the position, which the second light-emitting portion is to be formed, of the second photoresist layer is remained.

Accordingly, the second photoresist layer is not remained on the first light-emitting portion which has already been formed on the substrate. The only photoresist layer laminated on the first light-emitting portion is the first photoresist layer. Furthermore, the second light-emitting layer which is bared as a result of removal of the second photoresist layer is then removed by the subsequent process. Thus, the state which the second light-emitting layer and the second photoresist layer are laminated on the first light-emitting portion is avoided.

In the present process, the photoresist layer is subjected to pattern-exposure via a photomask. The method of exposing is the same as the conventional method of exposing.

In the example shown in FIG. 1(c), as the photoresist layer is the positive type, a photomask which portions corresponding the second photoresist layer shields light, is used. Conversely, when a negative-type photoresist is used, a photomask which exposes only at the portions corresponding the second photoresist layer, is used.

4. The Process of Forming the Second Light-emitting Portion

The process of forming the second light-emitting portion of the present invention comprises the process of removing the second light-emitting layer which is bared as a result of removal of the second photoresist layer by the previous process, thereby patterning the second light-emitting layer, thus forming the second light-emitting portion.

As a result of the previous process, only the portions of the second photoresist layer, in which the second light-emitting portion is to be formed, are remained. Therefore, when the second light-emitting portion is formed by the present process, the second light-emitting layer remains only at the portions in which the second light-emitting portion is to be formed. Accordingly, the second photoresist layer and the second light-emitting layer are not remained on the first light-emitting portion which has already been patterned, and a state in which unnecessary layers are laminated on the first light-emitting layer can be avoided.

As all the unnecessary layers have been removed from the upper surface of the first electrode layer, there arises an advantageous effect that inconveniences such as uneven thickness of layers caused by laminating a plurality of layers, can be eliminated. Further, as photoresist layers to be peeled off later, there is only one layer of the first photoresist layer is laminated on the first light-emitting portion. As the first photoresist layer is positioned as the uppermost layer, there arises another advantageous effect that the first photoresist layer can be quickly peeled off in the peeling treatment.

The process of forming the second light-emitting portion described above may be carried out according to the wet-type method using a solvent which dissolves the light-emitting layer or the dry-type method using dry etching. In the present invention, the dry-type method which does not cause inconveniences such as color-mixing is preferably used. Each of these methods will be described hereinafter.

(Wet-type Method)

The wet-type method in the present case is a method of dissolving and removing the second light-emitting layer by using a solvent which is capable of dissolving or peeling the light-emitting layer, without peeling the photoresist off. As such a solvent to be used, the aforementioned solvent of a light-emitting layer forming coating solution can be used. However, the solvent is not limited to such aforementioned examples, and solvents of other types which satisfy the requirements may be used.

The removal by the solvent may be carried out in an ultrasonic bath. Use of ultrasonic bath is preferable, because it enables highly precise patterning free from inconvenience such as erosion of the pattern or dissolution of the second light-emitting portion, and it enables highly precise patterning in a relatively short period.

In the present invention, condition of ultrasonic waves for the ultrasonic bath is preferably set at 25° C., of the oscillation frequency of at 20 to 100 KHz, and carrying out for 0.1 to 60 seconds. By setting such conditions, highly precise patterning is possible in a relatively short time.

(Dry-type Method)

On the other hand, the dry-type method is a method of removing the portions of the second light-emitting layer in which the second photoresist layer is removed, by dry etching.

Normally, a photoresist layer is formed significantly thicker than a light-emitting layer. Thus, the light-emitting layer can be removed by performing dry etching uniformly.

In this case, the film thickness of the photoresist layer is preferably in a range of 0.1 to 10 μm, and more preferably in a range of 0.5 to 5 μm. By setting the film thickness in the aforementioned range, dry etching in a high processing precise can be carried out, without damaging the resist function of the photoresist.

Therefore, the use of the dry etching enables making edge portions of the etched areas significantly sharper and thus making the widths of areas in which film thickness is uneven, which is present on the edge portions of the pattern, significantly narrower. As a result, there arises an advantageous effect that highly precise patterning is enabled.

The dry etching method used in the present invention is preferably conducted as reactive ion etching. By reactive ion etching, the organic film is chemically reacted and are decomposed to compounds having small molecular weight, the compounds can be removed from the substrate as a result of vaporization and evaporation, whereby processing by highly precise etching can be carried out in a short time.

In the present invention, it is preferable that oxygen alone or a gas containing oxygen is used in the aforementioned dry etching process. Use of oxygen alone or a gas containing oxygen enables removal by the oxidation of the organic film. As a result, unnecessary organic substances can be removed from the substrate, whereby processing by highly precise etching can be carried out in a short time. Further, under this condition, oxygen alone or a gas containing oxygen does not etch the transparent conductive film of oxides such as ITO, which is generally used. That is effective in that a surface of the electrode can be cleaned without damaging the electrode characteristic.

In the present invention, it is preferable that atmospheric plasma is used in the aforementioned dry etching process. Dry etching, which generally requires a vacuum facility, can be carried out under the atmospheric pressure by using atmospheric plasma, whereby the time and cost required for the treatment can be reduced. In this case, etching can be performed by utilizing oxidizing resolving of organic substances by plasmatic oxygen in the atmosphere. The gas composition of the reaction atmosphere may be adjusted, as desired, by substitution and circulation.

In a case in which a two-color EL element is produced, the first photoresist layer and the second photoresist layer positioned on each light-emitting portions, respectively, are peeled off after the process of forming the second light-emitting portion, so that the first and second light-emitting portions are bared. The second electrode layer is then formed on each light-emitting portion, whereby an EL element which effects two-color luminescence can be manufactured.

5. The Process of Forming the Third Photoresist Layer

The process of forming the third photoresist layer of the present invention comprises the process of: coating the third light-emitting layer forming coating solution on a substrate provided with the first electrode layer, the first light-emitting portion formed on the first electrode layer and having the first photoresist layer on the surface, and the second light-emitting portion, formed in a pattern-like configuration similarly on the first electrode layer, having the second photoresist layer on the surface; thereby forming the third light-emitting layer; and then, coating photoresist to the entire surface of the third light-emitting layer, thereby forming the third photoresist layer.

As the third light-emitting layer forming coating solution, the third light-emitting layer and the third photoresist layer constituting the present process are similar to those described in detail in "the process of preparing the first light-emitting portion", the description thereof will be omitted.

6. The Process of Patterning the Third Photoresist Layer

In the present invention, the process of pattering the third photoresist layer comprises a process of: masking by a photomask and pattern-exposing only the portions which the third light-emitting portion is to be formed, of the third photoresist layer formed on the third light-emitting layer, and then developing by using a photoresist developer, thereby patterning such that only the portions of the third photoresist layer, which the third light-emitting portion is to be formed, are remained.

In the present invention, the present process of patterning the third photoresist layer is characterized in that only portions of the third photoresist layer, which the third light-emitting portion is to be formed, are masked by a photomask and pattern exposed.

As a result, the third photoresist layer is remained only on the third light-emitting portion, and the third photoresist layer is not remained on the first light-emitting portion and the second light-emitting portion which have already been pattern-formed. Therefore, in the subsequent process of forming the third light-emitting portion, the third light-emitting layer located on the first and the second light-emitting portions are removed. Accordingly, the state in which a plurality of unnecessary layers are laminated on the first and the second light-emitting portions is avoided. Thus, there arises an advantageous effect that the peeling treatment can be effected quickly when the photoresist layer is peeled off.

Other features about the photoresist developer is similar to those described in detail in "the process of preparing the first light-emitting portion", description thereof will be omitted.

7. The Process of Forming the Third Light-emitting Portion

The present process of forming the third light-emitting portion of the invention comprises the process of removing portions of the third light-emitting layer, which is bared as a result of removal of the third photoresist layer in the previous process, thereby forming the third light-emitting layer in a pattern-like configuration and obtaining the third light-emitting portion.

In the present process, when forming the third light-emitting portion, the third light-emitting layer is laminated only at the portions thereof which the third light-emitting portion is to be formed. Accordingly, the third photoresist layer and the third light-emitting layer are remained on neither the first nor the second light-emitting portion which have already been patterned. As a result, a state in which a plurality of unnecessary layers are laminated on both light-emitting portions can be avoided. Therefore, when the present process is completed, each light-emitting portions can be formed in a state which the first photoresist layer is formed on the first light-emitting portion, the second photoresist layer is formed on the second light-emitting portion, and the third photoresist layer is formed on the third light-emitting portion.

In this state, excellent stability in storage is maintained because the photoresist layers function as protecting layers. Therefore, distribution in this state is possible, due to the excellent distribution resistance. Further, the peeling treatment of the photoresist layer in the subsequent process can be carried out easily. Thus, an EL element which can well meet the demand from the market can be provided.

8. The Peeling Process

The peeling process of the present invention comprises the process of peeling the photoresist layer located on each light-emitting portion by using a photoresist peeling solution.

In the present process, only one layer of the photoresist layer is formed on each light-emitting portion which is pattern-formed on the substrate, and each photoresist layer is positioned at the uppermost layer. Therefore, in the present process, each photoresist layer can be peeled off easily by the photoresist peeling solution.

In the present process, the photoresist layer can be peeled off by a method of immersing the substrate in the photoresist peeling solution, a method of shower-injecting the photoresist peeling solution onto the substrate, or the like.

The solution used in the present invention for peeling the photoresist layer off is not particularly limited, as long as the solvent is capable of dissolving the photoresist layer without dissolving each light-emitting portion. The solvents for the photoresist as described above may be used as the photoresist peeling solution. In a case which a positive-type resist is used, the aforementioned examples of the photoresist developer used after UV exposure can also be used for peeling the photoresist layer.

Further, solvents such as a strong alkali aqueous solution, dimethylformamide, dimethylacetoamide, dimethylsulfoxide, N-methyl-2-pyrolidone; a mixture thereof; and a commercially available photoresist peeling solutions may be used.

The present invention is not limited to the embodiment described above. The aforementioned embodiment is merely an example, and whatever is substantially equivalent, in terms of structure and effect, to the technological idea defined in the claims of the present invention is included to the technological scope of the present invention.

EXAMPLES

The present invention will be further described by way of the following examples.

Example 1

(Production of an Organic EL Layer of the First Color)

On a transparent glass substrate which indium tin oxide (ITO) as a first electrode layer is formed thereon, a coating solution for a hole-injection layer (poly(3,4) ethylenediox-ythiophene/polystyrene sulphonate: PEDT/PSS: "Baytron P" manufactured by Bayer Yakuhin, Ltd., shown in the following chemical formula (1)) was coated on the entire surface by spin coating method. The coating was dried, whereby the first hole-injection layer of film thickness of 800 Å was formed.

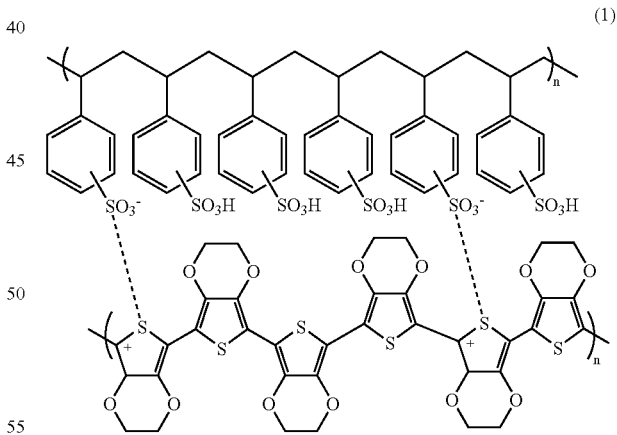

(1)

Next, 1 wt. % xylene solution of polyparaphenylene vinylene derivative (MEH-PPV) was prepared as the first light-emitting layer, coated on the entire surface of the hole injection layer by spin coating method, dried and the first light-emitting layer of film thickness of 1000 Å was formed, whereby an organic EL layer was formed.

(Production of a Photoresist Layer of the First Color)

Thereafter, positive-type photoresist (OFPR-800, manufactured by Tokyo Ohka Kogyo Co. Ltd.,) was coated on the entire surface of the first light-emitting layer by spin coating method, dried, whereby a first photoresist layer of film thickness of 1 μm was formed.

(Patterning of the First Color)

Next, UV was irradiated by an alignment exposure device, by using a photomask (line width (light-shielding portion): 85 μm, space width (light-transmitting portion): 215 μm) prepared such that the light-shielding portion thereof corresponded to the first light-emitting portion, then the photoresist of the irradiated portion was removed by a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that the substrate structure was as shown in FIG. 1(a).

(Formation of an Organic EL Layer of the Second Color)

Next, a second hole-injection layer, the second light-emitting layer (MEH-PPV) and the second photoresist layer were formed according to a wet-type process, without peeling the photoresist which had been remained.

(Patterning of the Second Color)

Then, UV was exposed by using the aforementioned photomask in a manner that the substrate was laterally shifted by 1 pitch (100 μm), as compared with the exposure for the first color, the photoresist at the exposed portions was removed by using a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that for the first light-emitting portion, the first photoresist was formed on the first organic EL layer and both the second light-emitting layer and the second photoresist were completely removed from the first light-emitting portion and that the substrate structure was as shown in FIG. 1(e).

(Formation of an Organic EL Layer of the Third Color)

After the dry etching was completed, a third hole-injection layer, the third light-emitting layer (MEH-PPV) and the third photoresist layer were formed by the wet-type process, without peeling the photoresist.

(Patterning of the Third Color)

Then, alignment exposure was performed by an alignment exposure device with the photomask described above, in a manner that the substrate was laterally shifted by two pitches (200 μm), as compared with the exposure for the first color. The photoresist at the exposed portions was then removed by a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that for the first light-emitting portion, the first photoresist was formed on the first organic EL layer and both the third light-emitting layer and the third photoresist were completely removed from the first light-emitting portion.

Further, it was confirmed that for the second light-emitting portion, the second photoresist was formed on the second organic EL layer and both the third light-emitting portion and the third photoresist were completely removed, the cross section of the substrate structure was as shown in FIG. 1(i).

(Peeling of the Resist)

The remaining resist which is not exposed was immersed in a resist solvent for 10 minutes at the room temperature, so that only the resist was completely removed, whereby a substrate was obtained on which an organic EL layer, patterned by line width of 85 μm and space width of 15 μm, is formed.

Comparative Example 1

(Production of an Organic EL Layer of the First Color)

On a transparent glass substrate which indium tin oxide (ITO) as a first electrode layer is formed thereon, a coating solution for a hole-injection layer same as example 1 (poly (3,4) ethylenedioxythiophene/polystyrene sulphonate: PEDT/PSS: "Baytron P" manufactured by Bayer Yakuhin, Ltd.) was coated on the entire surface by spin coating method. The coating was dried, whereby the first hole-injection layer of film thickness of 800 Å was formed.

Next, 1 wt. % xylene solution of polyparaphenylene vinylene derivative (MEH-PPV) was prepared as the first light-emitting layer, coated on the entire surface of the hole injection layer by spin coating method, dried and the first light-emitting layer of film thickness of 1000 Å was formed, whereby an organic EL layer was formed.

(Production of a Photoresist Layer of the First Color)

Thereafter, positive-type photoresist (OFPR-800, manufactured by Tokyo Ohka Kogyo Co. Ltd.,) was coated on the entire surface of the first light-emitting layer by spin coating method, dried, whereby a first photoresist layer of film thickness of 1 μm was formed.

(Patterning of the First Color)

Next, UV was irradiated by an alignment exposure device, by using a photomask (line width (light-shielding portion): 85 μm, space width (light-transmitting portion): 215 μm) prepared such that the light-shielding portion thereof corresponded to the first light-emitting portion, then the photoresist of the irradiated portion was removed by a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that the substrate structure was as shown in FIG. 2(a).

(Formation of an Organic EL Layer of the Second Color)

Next, a second hole-injection layer, the second light-emitting layer (MEH-PPV) and the second photoresist layer were formed according to a wet-type process, without peeling the photoresist which had been remained.

(Patterning of the Second Color)

Then, UV was exposed by using a photomask prepared so that portions corresponding the first light-emitting portion and the second light-emitting portion are made to be light-shielding portions, the photoresist at the exposed portions was removed by using a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that the second light-emitting layer and the second photoresist were formed on the first light-emitting portion and that the substrate structure was as shown in FIG. 2(e).

(Formation of an Organic EL Layer of the Third Color)

After the dry etching was completed, a third hole-injection layer, the third light-emitting layer (MEH-PPV) and the third photoresist layer were formed by the wet-type process, without peeling the photoresist.

(Patterning of the Third Color)

Then, alignment exposure was performed by an alignment exposure device with a photomask prepared so that portions corresponding the first light-emitting portion, the second light-emitting portion, and the third light-emitting portion are made to be light-shielding portions. The photoresist at the exposed portions was then removed by a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

Figure 2I:
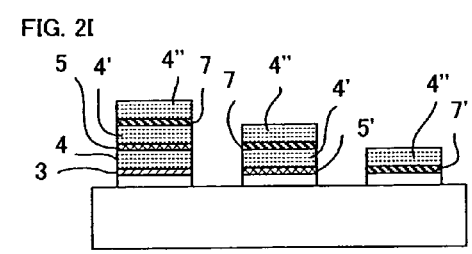
Figure 2J:
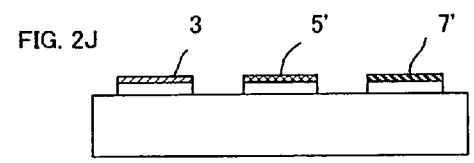

This substrate was observed by a microscope, the film thickness was measured, and a cross section was observed. It was confirmed that the second light-emitting portion, the second photoresist, the third light-emitting portion, and the third photoresist were formed on the first light-emitting portion, the third light-emitting portion and the third photoresist were formed on the second light-emitting portion, and the substrate structure was as shown in FIG. 2(i).

(Peeling of the Resist)

The remaining resist which is not exposed was immersed in a resist solvent for 180 minutes at the room temperature. However, a large number of spots, on the first light-emitting portion, where the first photoresist and the second light-emitting portion are remained, spots where the first photoresist, the second light-emitting portion, the second photoresist and the third light-emitting portion are remained. On the second light-emitting portion, spots where the third light-emitting portion is remained, and spots where the third light-emitting portion was missing were found.

(Evaluation of the Light-emitting Property of the EL Element)

Next, a metal electrode was formed on the substrates obtained by example 1 and comparative example 1. As the metal electrode, calcium was vapor-deposited such that the thickness is 1000 Å. Further, as an anti-oxidization layer, silver was vapor-deposited such that the thickness is 2000 Å.

The ITO electrode side was connected to an anode and the metal electrode side was connected to a cathode, and a direct current was applied by a source meter. Light-emitting at the wavelength of 580 nm was observed when the applied voltage was in the vicinity of 10 V.

Further, the light-emitting portions were observed by a microscope. In the example 1, it was confirmed that the lines of 85 μm are emitting light uniformly. Conversely, in comparative example 1, a large number of portions where light is not emitted (dark spots) were observed in the lines of 85 μm width.

Example 2

(Production of an Organic EL Layer of the First Color)

On a transparent glass substrate which indium tin oxide (ITO) as a first electrode layer is formed thereon, a coating solution for a hole-injection layer same as the example 1 (poly(3,4) ethylenedioxythiophene/polystyrene sulphonate: PEDT/PSS: "Baytron P" manufactured by Bayer Yakuhin, Ltd.) was coated on the entire surface by spin coating method. The coating was dried, whereby the first hole-injection layer of film thickness of 800 Å was formed.

Next, as the first light-emitting layer, on the hole-injection layer, 1 ml of a coating solution of a red color light emitting organic material (70 parts by weight of polyvinyl carbazole, 30 parts by weight of oxadiazole, 1 parts by weight of dicyanomethylenepyran derivative, 4900 parts by weight of monochlorobenzene) was applied dropwise to the center portion of the substrate, and spin-coated. A layer was formed by carrying out spin coating at 2000 rpm for 10 seconds. The thickness of the resulting film was 800 Å.

(Production of a Photoresist Layer of the First Color)

Thereafter, positive-type photoresist (OFPR-800, manufactured by Tokyo Ohka Kogyo Co. Ltd.,) was coated on the entire surface of the first light-emitting layer by spin coating method, dried, whereby a first photoresist layer of film thickness of 1 μm was formed.

(Patterning of the First Color)

Next, UV was irradiated by an alignment exposure device, by using a photomask (line width (light-shielding portion): 85 μm, space width (light-transmitting portion): 215 μm) prepared such that the light-shielding portion thereof corresponded to the first light-emitting portion, then the photoresist of the irradiated portion was removed by a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that the substrate structure was as shown in FIG. 1(a).

(Formation of an Organic EL Layer of the Second Color)

Next, the second hole-injection layer was formed, without peeling the remaining photoresist. Thereafter, as the second light-emitting layer, 1 ml of a coating solution of a green color light-emitting organic material (70 parts by weight of polyvinyl carbazole, 30 parts by weight of oxadiazole, 1 parts by weight of coumalin 6, 4900 parts by weight of monochlorobenzene) was applied dropwise to the center portion of the substrate, and spin-coated. A layer was formed by carrying out the spin coating at 2000 rpm for 10 seconds. The thickness of the resulting film was 800 Å. A photoresist layer was formed by a wet-type process on the obtained substrate.

(Patterning of the Second Color)

Then, UV was exposed by using the aforementioned photomask in a manner that the substrate was laterally shifted by 1 pitch (100 μm), as compared with the exposure for the first color, the photoresist at the exposed portions was removed by using a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed. This substrate was observed by a microscope, the film thickness was measured, and a cross section was observed. It was confirmed that for the first light-emitting portion, the first photoresist was formed on the first organic EL layer and both the second light-emitting layer and the second photoresist were completely removed from the first light-emitting portion and that the substrate structure was as shown in FIG. 1(e).

(Formation of an Organic EL Layer of the Third Color)

After the dry etching was completed, the third hole-injection layer was formed, without peeling the remaining photoresist. Thereafter, as the third light-emitting layer, a coating solution of a blue color light-emitting organic material (70 parts by weight of polyvinyl carbazole, 30 parts by weight of oxadiazole, 1 parts by weight of perylene, 4900 parts by weight of monochlorobenzene) was applied dropwise to the center portion of the substrate, and spin-coated. A layer was formed by carrying out the spin coating at 2000 rpm for 10 seconds. The thickness of the resulting film was 800 Å. A photoresist layer was formed by a wet-type process on the obtained substrate.

(Patterning of the Third Color)

Then, alignment exposure was performed by an alignment exposure device with the photomask described above, in a manner that the substrate was laterally shifted by two pitches (200 μm), as compared with the exposure for the first color. The photoresist at the exposed portions was then removed by a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that for the first light-emitting portion, the first photoresist was formed on the first organic EL layer and both the third light-emitting layer and the third photoresist were completely removed from the first light-emitting portion.

Further, it was confirmed that for the second light-emitting portion, the second photoresist was formed on the second organic EL layer and both the third light-emitting portion and the third photoresist were completely removed, the cross section of the substrate structure was as shown in FIG. 1(i).

(Peeling of the Resist)

The remaining resist which is not exposed was immersed in a resist solvent for 10 minutes at the room temperature, so that only the resist was completely removed, whereby a substrate was obtained on which an organic EL layer, patterned by line width of 85 μm and space width of 15 μm, is formed.

Comparative Example 2

(Production of an Organic EL Layer of the First Color)

On a transparent glass substrate which indium tin oxide (ITO) as a first electrode layer is formed thereon, a coating solution for a hole-injection layer same as the example 1 (poly(3,4) ethylenedioxythiophene/polystyrene sulphonate: PEDT/PSS: "Baytron P" manufactured by Bayer Yakuhin, Ltd.) was coated on the entire surface by spin coating method. The coating was dried, whereby the first hole-injection layer of film thickness of 800 Å was formed.

Next, as the first light-emitting layer, on the hole-injection layer, 1 ml of a coating solution of a red color light emitting organic material (70 parts by weight of polyvinyl carbazole, 30 parts by weight of oxadiazole, 1 parts by weight of dicyanomethylenepyran derivative, 4900 parts by weight of monochlorobenzene) was applied dropwise to the center portion of the substrate, and spin-coated. A layer was formed by carrying out spin coating at 2000 rpm for 10 seconds. The thickness of the resulting film was 800 Å.

(Production of a Photoresist Layer of the First Color)

Thereafter, positive-type photoresist (OFPR-800, manufactured by Tokyo Ohka Kogyo Co. Ltd.,) was coated on the entire surface of the first light-emitting layer by spin coating method, dried, whereby a first photoresist layer of film thickness of 1 μm was formed.

(Patterning of the First Color)

Next, UV was irradiated by an alignment exposure device, by using a photomask (line width (light-shielding portion): 85 μm, space width (light-transmitting portion): 215 μm) prepared such that the light-shielding portion thereof corresponded to the first light-emitting portion, then the photoresist of the irradiated portion was removed by a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that the substrate structure was as shown in FIG. 2(a).

(Formation of an Organic EL Layer of the Second Color)

Next, the second hole-injection layer was formed, without peeling the remaining photoresist. Thereafter, as the second light-emitting layer, 1 ml of a coating solution of a green color light-emitting organic material (70 parts by weight of polyvinyl carbazole, 30 parts by weight of oxadiazole, 1 parts by weight of coumalin 6, 4900 parts by weight of monochlorobenzene) was applied dropwise to the center portion of the substrate, and spin-coated. A layer was formed by carrying out the spin coating at 2000 rpm for 10 seconds. The thickness of the resulting film was 800 Å. A photoresist layer was formed by a wet-type process on the obtained substrate.

(Patterning of the Second Color)

Then, UV was exposed by using a photomask prepared so that portions corresponding the first light-emitting portion and the second light-emitting portion are made to be light-shielding portions, the photoresist at the exposed portions was removed by using a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that the second light-emitting portion and the second photoresist were formed on the first light-emitting portion and that the substrate structure was as shown in FIG. 2(e).

(Formation of an Organic EL Layer of the Third Color)

After the dry etching was completed, the third hole-injection layer was formed, without peeling the remaining photoresist. Thereafter, as the third light-emitting layer, a coating solution of a blue color light-emitting organic material (70 parts by weight of polyvinyl carbazole, 30 parts by weight of oxadiazole, 1 parts by weight of perylene, 4900 parts by weight of monochlorobenzene) was applied dropwise to the center portion of the substrate, and spin-coated. A layer was formed by carrying out the spin coating at 2000 rpm for 10 seconds. The thickness of the resulting film was 800 Å. A photoresist layer was formed by a wet-type process on the obtained substrate.

(Patterning of the Third Color)

Then, alignment exposure was performed by an alignment exposure device with a photomask prepared so that portions corresponding the first light-emitting portion, the second light-emitting portion, and the third light-emitting portion are made to be light-shielding portions. The photoresist at the exposed portions was then removed by a resist developer (NMD-3, manufactured by Tokyo Ohka Kogyo Co. Ltd.,). Thereafter, dry etching was performed by an atmospheric pressure plasma device, whereby portions of the organic EL layer, which the photoresist is removed, were removed.

This substrate was observed by a microscope, the film thickness was measured, and a cross section was observed. It was confirmed that the second light-emitting portion, the second photoresist, the third light-emitting portion, and the third photoresist were formed on the first light-emitting portion, the third light-emitting portion and the third photoresist were formed on the second light-emitting portion, and the substrate structure was as shown in FIG. 2(i).

(Peeling of the Resist)

The remaining resist which is not exposed was immersed in a resist solvent for 180 minutes at the room temperature. However, a large number of spots where the first photoresist and the second light-emitting portion are remained on the first light-emitting portion, spots where the first photoresist, the second light-emitting portion, the second photoresist and the third light-emitting portion are remained, spots where the third light-emitting portion is remained on the second light-emitting portion, and spots where the third light-emitting portion was missing were found.

(Evaluation of the Light-emitting Property of the EL Element)

Next, a metal electrode was formed on the substrates obtained by example 2 and comparative example 2. As the metal electrode, calcium was vapor-deposited such that the thickness is 1000 Å. Further, as an anti-oxidization layer, silver was vapor-deposited such that the thickness is 2000 Å.

The ITO electrode side was connected to an anode and the metal electrode side was connected to a cathode, and a direct current was applied by a source meter. Light-emitting was observed when the applied voltage was in the vicinity of 10 V.

Further, the light-emitting portions were observed by a microscope. In the example. 2, it was confirmed that the lines of 85 μm are emitting light uniformly. Conversely, in comparative example 2, a large number of portions where light is not emitted (dark spots) were observed in the lines of 85 μm width.

The invention claimed is:

1. A method for manufacturing an electroluminescent element by photolithography, comprising:
a process of providing a light-emitting portion of at least one color, having only one photoresist layer on a surface thereof, on a substrate;
a process of forming a heterochromatic light-emitting layer by coating the substrate with a heterochromatic light-emitting layer forming coating solution which expresses a different color from the color of the above light-emitting portion;
a process of forming a photoresist layer for the heterochromatic light-emitting layer by coating the heterochromatic light-emitting layer with a photoresist;
a process of pattern-exposing and developing the photoresist layer for the heterochromatic light-emitting layer, such that only portions of the photoresist layer for the heterochromatic light-emitting layer which the heterochromatic light-emitting portion is to be formed, are remained; and
a process of forming the heterochromatic light-emitting portion, having only the photoresist layer for the heterochromatic light-emitting layer on a surface thereof, in a pattern by removing portions of the heterochromatic light-emitting layer which the photoresist layer for the heterochromatic light-emitting layer is removed, to provide the light-emitting portion of at least one color having only one photoresist layer on the surface thereof, and the heterochromatic light-emitting portion having only the photoresist layer for the heterochromatic light-emitting layer on the surface thereof, on the substrate.

2. The method for manufacturing an electroluminescent element according to claim 1, wherein each of the light-emitting layers is insoluble to a photoresist solvent, a photoresist developer and a photoresist peeling solution, and each of the photoresist layers is insoluble to a solvent used for forming each of the light-emitting layers.

3. The method for manufacturing an electroluminescent element according to claim 1, wherein each of the light-emitting portions is subjected to the patterning process together with a buffer layer and is formed on the buffer layer.

4. The method for manufacturing an electroluminescent element by photolithography according to claim 1, wherein after patterning each photoresist layer by coating each light-emitting layer to be patterned with photoresist, exposing, and developing, portions of each light-emitting layer, in which each photoresist layer is removed, is patterned by dry etching.

5. The method for manufacturing an electroluminescent element according to claim 4, wherein the type of dry etching is a reactive ion etching.

6. The method for manufacturing an electroluminescent element according to claim 4, wherein oxygen alone or a gas containing oxygen is used in the dry etching.

7. The method for manufacturing an electroluminescent element according to claim 4, wherein atmospheric pressure plasma is used in the dry etching.

8. A method for manufacturing an electroluminescent element by photolithography, comprising:
a process of providing a first light-emitting portion having only a first photoresist layer on a surface thereof, on a substrate;
a process of forming a second light-emitting layer by coating the substrate with a second light-emitting layer forming coating solution;
a process of forming a second photoresist layer by coating the second light-emitting layer with a photoresist;
a process of pattern-exposing and then developing the second photoresist layer, such that only portions of the second photoresist layer which the second light-emitting portion is to be formed, are remained;
a process of forming the second light-emitting portion, having only the second photoresist layer on a surface thereof, in a pattern by removing portions of the second light-emitting layer which the second photoresist layer is removed, to provide the first light-emitting portion having only the first photoresist layer on the surface thereof, and the second light-emitting portion having only the second photoresist layer on the surface thereof, on the substrate;

a process of forming a third light-emitting layer by coating the substrate with a third light-emitting layer forming coating solution;

a process of forming a third photoresist layer by coating the third light-emitting layer with a photoresist;

a process of pattern-exposing and then developing the third photoresist layer, such that only portions of the third photoresist layer which the third light-emitting portion is to be formed, are remained;

a process of forming the third light-emitting portion, having only the third photoresist layer on a surface thereof, in a pattern by removing portions of the third light-emitting layer which the third photoresist layer is removed, to provide the first light-emitting portion having only the first photoresist layer on the surface thereof, the second light-emitting portion having only the second photoresist layer on the surface thereof, and the third light-emitting portion having only the third photoresist layer on the surface thereof, on the substrate.

9. The method for manufacturing an electroluminescent element according to claim 8, wherein each of the light-emitting layers is insoluble to a photoresist solvent, a photoresist developer and a photoresist peeling solution, and each of the photoresist layers is insoluble to a solvent used for forming each of the light-emitting layers.

10. The method for manufacturing an electroluminescent element according to claim 8, wherein each of the light-emitting portions is subjected to the patterning process together with a buffer layer and is formed on the buffer layer.

11. The method for manufacturing an electroluminescent element by photolithography according to claim 8, wherein after patterning each photoresist layer by coating each light-emitting layer to be patterned with photoresist, exposing, and developing, portions of each light-emitting layer, in which each photoresist layer is removed, is patterned by dry etching.

12. The method for manufacturing an electroluminescent element according to claim 11, wherein the type of dry etching is a reactive ion etching.

13. The method for manufacturing an electroluminescent element according to claim 11, wherein oxygen alone or a gas containing oxygen is used in the dry etching.

14. The method for manufacturing an electroluminescent element according to claim 11, wherein atmospheric pressure plasma is used in the dry etching.

* * * * *